(12) United States Patent
Rough et al.

(10) Patent No.: US 12,002,611 B2
(45) Date of Patent: Jun. 4, 2024

(54) HIGH POWER LOW FREQUENCY COILS

(71) Applicant: COMET TECHNOLOGIES USA, INC., San Jose, CA (US)

(72) Inventors: Kirkwood Rough, San Jose, CA (US); Aaron Cuttino, San Jose, CA (US)

(73) Assignee: COMET TECHNOLOGIES USA, INC., San Jose, CA (US)

(*) Notice: Subject to any disclaimer, the term of this patent is extended or adjusted under 35 U.S.C. 154(b) by 671 days.

(21) Appl. No.: 17/006,693

(22) Filed: Aug. 28, 2020

(65) Prior Publication Data
US 2021/0065956 A1    Mar. 4, 2021

Related U.S. Application Data

(60) Provisional application No. 62/893,066, filed on Aug. 28, 2019.

(51) Int. Cl.
| H01F 27/06 | (2006.01) |
| H01F 27/00 | (2006.01) |
| H01F 27/28 | (2006.01) |
| H01F 41/064 | (2016.01) |
| H01J 37/32 | (2006.01) |

(52) U.S. Cl.
CPC ....... *H01F 27/006* (2013.01); *H01F 27/2828* (2013.01); *H01F 41/064* (2016.01); *H01J 37/321* (2013.01)

(58) Field of Classification Search
CPC .. H01F 27/006; H01F 27/2828; H01F 41/064; H01F 27/325; H01F 37/005; H01F 5/00; H01J 37/321; H01J 37/3211; H01J 37/32183; H05H 1/24
See application file for complete search history.

(56) References Cited

U.S. PATENT DOCUMENTS

| 1,017,348 A | * | 2/1912 | Torchio .................. H01F 38/12 336/59 |
| 4,188,177 A | | 2/1980 | Kilby et al. |
| 4,422,078 A | | 12/1983 | Cremeen |

(Continued)

FOREIGN PATENT DOCUMENTS

| CN | 1404184 A | 3/2003 |
| CN | 1509493 A | 6/2004 |

(Continued)

OTHER PUBLICATIONS

PCT/US2020/038892—International Search Report and Written Opinion of the International Searching Authority, dated Oct. 6, 2020, 3 pages.

(Continued)

*Primary Examiner* — Tuyen T Nguyen (74) *Attorney, Agent, or Firm* — Nolte Lackenbach Siegel (57) ABSTRACT

A coil having a coil body and a plurality of concentric cross-section windings of wire disposed around the coil body, the wire having a spacing between adjacent turns of about 0.25 to 1.0 of the radius of the wire. Also, a coil for a plasma processing device, the coil having a coil body and a plurality of concentric cylindrical cross-section windings of wire disposed around the coil body, the wire having a spacing between adjacent turns of about 0.25 to 1.0 of the radius of the wire and a diameter to length ratio of between about 2:1 and about 3:1.

20 Claims, 11 Drawing Sheets

(56) References Cited

U.S. PATENT DOCUMENTS

| | | | |
|---|---|---|---|
| 4,477,792 A * | 10/1984 | Putman et al. | ....... H01F 37/005 336/185 |
| 4,679,007 A | 7/1987 | Reese et al. | |
| 5,052,997 A | 10/1991 | Ruggera | |
| 5,175,472 A | 12/1992 | Johnson, Jr. et al. | |
| 5,195,045 A | 3/1993 | Keane et al. | |
| 5,394,061 A | 2/1995 | Fujii | |
| 5,474,648 A | 2/1995 | Patrick et al. | |
| 5,576,629 A | 11/1996 | Turner et al. | |
| 5,609,737 A | 3/1997 | Fukui et al. | |
| 5,629,653 A | 5/1997 | Stimson | |
| 5,737,175 A | 4/1998 | Grosshart et al. | |
| 5,792,261 A | 8/1998 | Hama et al. | |
| 5,810,963 A | 9/1998 | Tomioka | |
| 5,842,154 A | 11/1998 | Harnett et al. | |
| 5,849,136 A | 12/1998 | Mintz et al. | |
| 5,866,869 A | 2/1999 | Schneider | |
| 5,889,252 A | 3/1999 | Williams et al. | |
| 5,910,886 A | 6/1999 | Coleman | |
| 5,914,974 A | 6/1999 | Partlo | |
| 6,016,131 A | 1/2000 | Sato et al. | |
| 6,157,179 A | 12/2000 | Miermans | |
| 6,164,241 A | 12/2000 | Chen et al. | |
| 6,252,354 B1 | 6/2001 | Collins et al. | |
| 6,313,584 B1 | 11/2001 | Johnson et al. | |
| 6,313,587 B1 | 11/2001 | MacLennan et al. | |
| 6,326,597 B1 | 12/2001 | Lubomirsky et al. | |
| 6,407,648 B1 | 6/2002 | Johnson | |
| 6,463,875 B1 | 10/2002 | Chen et al. | |
| 6,507,155 B1 | 1/2003 | Barnes et al. | |
| 6,677,828 B1 | 1/2004 | Harnett et al. | |
| 6,703,080 B2 | 3/2004 | Reyzelman | |
| 6,806,437 B2 | 10/2004 | Oh | |
| 6,876,155 B2 | 4/2005 | Howald et al. | |
| 6,894,245 B2 | 5/2005 | Hoffman | |
| 6,949,887 B2 | 9/2005 | Kirkpatrick et al. | |
| 7,030,335 B2 | 4/2006 | Hoffman | |
| 7,042,311 B1 | 5/2006 | Hilliker et al. | |
| 7,079,597 B1 | 7/2006 | Kenwood | |
| 7,102,292 B2 | 9/2006 | Parsons et al. | |
| 7,192,505 B2 | 3/2007 | Roche et al. | |
| 7,196,283 B2 | 3/2007 | Buchberger, Jr. | |
| 7,215,697 B2 | 5/2007 | Hill et al. | |
| 7,220,937 B2 | 5/2007 | Hoffman | |
| 7,251,121 B2 | 7/2007 | Bhutta | |
| 7,259,623 B2 | 8/2007 | Coleman | |
| 7,298,128 B2 | 11/2007 | Bhutta | |
| 7,467,612 B2 | 12/2008 | Suckewer | |
| 7,514,936 B2 | 4/2009 | Anwar | |
| 7,795,877 B2 | 9/2010 | Radtke | |
| 7,796,368 B2 | 9/2010 | Kotani | |
| 8,169,162 B2 | 5/2012 | Yuzurihara | |
| 8,169,262 B2 | 5/2012 | Hung | |
| 8,203,372 B2 | 6/2012 | Arduini | |
| 8,222,822 B2 | 7/2012 | Gilbert | |
| 8,421,377 B2 | 4/2013 | Kirchmeier | |
| 8,466,622 B2 | 6/2013 | Knaus | |
| 8,471,746 B2 | 6/2013 | Kurunezi et al. | |
| 8,491,759 B2 | 7/2013 | Pipitone et al. | |
| 8,742,669 B2 | 6/2014 | Carter et al. | |
| 8,779,662 B2 | 7/2014 | Boston | |
| 8,803,424 B2 | 8/2014 | Boston | |
| 8,884,180 B2 | 11/2014 | Ilie | |
| 8,896,391 B2 | 11/2014 | du Toit | |
| 8,928,229 B2 | 1/2015 | Boston | |
| 9,042,121 B2 | 5/2015 | Walde et al. | |
| 9,065,426 B2 | 6/2015 | Mason et al. | |
| 9,105,447 B2 | 8/2015 | Brouk et al. | |
| 9,111,725 B2 | 8/2015 | Boston | |
| 9,124,248 B2 | 9/2015 | Van Zyl et al. | |
| 9,142,388 B2 | 9/2015 | Hoffman et al. | |
| 9,148,086 B2 | 9/2015 | Fife et al. | |
| 9,166,481 B1 | 10/2015 | Vinciarelli | |
| 9,171,700 B2 | 10/2015 | Gilmore | |
| 9,196,459 B2 | 11/2015 | Bhutta | |
| 9,208,992 B2 | 12/2015 | Brouk et al. | |
| 9,224,579 B2 | 12/2015 | Finley et al. | |
| 9,225,299 B2 | 12/2015 | Mueller et al. | |
| 9,287,098 B2 | 3/2016 | Finley et al. | |
| 9,294,100 B2 | 3/2016 | Van Zyl et al. | |
| 9,306,533 B1 | 4/2016 | Mavretic | |
| 9,313,870 B2 | 4/2016 | Walde et al. | |
| 9,337,804 B2 | 5/2016 | Mason et al. | |
| 9,345,122 B2 | 5/2016 | Bhutta | |
| 9,385,021 B2 | 7/2016 | Chen | |
| 9,418,822 B2 | 8/2016 | Kaneko | |
| 9,478,397 B2 | 10/2016 | Blackburn et al. | |
| 9,483,066 B2 | 11/2016 | Finley et al. | |
| 9,490,353 B2 | 11/2016 | Van Zyl et al. | |
| 9,496,122 B1 | 11/2016 | Bhutta | |
| 9,520,269 B2 | 12/2016 | Finley et al. | |
| 9,524,854 B2 | 12/2016 | Hoffman et al. | |
| 9,525,412 B2 | 12/2016 | Mavretic | |
| 9,536,713 B2 | 1/2017 | Van Zyl et al. | |
| 9,543,122 B2 | 1/2017 | Bhutta | |
| 9,544,987 B2 | 1/2017 | Mueller et al. | |
| 9,558,917 B2 | 1/2017 | Finley et al. | |
| 9,577,516 B1 | 2/2017 | Van Zyl et al. | |
| 9,578,731 B2 | 2/2017 | Van Zyl | |
| 9,584,090 B2 | 2/2017 | Mavretic | |
| 9,589,767 B2 | 3/2017 | Hoffman et al. | |
| 9,591,739 B2 | 3/2017 | Bhutta | |
| 9,620,340 B2 | 4/2017 | Finley et al. | |
| 9,651,957 B1 | 5/2017 | Finley et al. | |
| 9,660,613 B2 | 5/2017 | Van Zyl et al. | |
| 9,673,028 B2 | 6/2017 | Walde et al. | |
| 9,697,911 B2 | 7/2017 | Bhutta | |
| 9,711,331 B2 | 7/2017 | Mueller et al. | |
| 9,711,335 B2 | 7/2017 | Christie et al. | |
| 9,728,378 B2 | 8/2017 | Bhutta et al. | |
| 9,729,122 B2 | 8/2017 | Mavretic | |
| 9,741,544 B2 | 8/2017 | Van Zyl et al. | |
| 9,745,660 B2 | 8/2017 | Bhutta | |
| 9,748,076 B1 | 8/2017 | Choi et al. | |
| 9,755,641 B1 | 9/2017 | Bhutta | |
| 9,773,644 B2 | 9/2017 | Van Zyl et al. | |
| 9,807,863 B1 | 10/2017 | Van Zyl et al. | |
| 9,812,305 B2 | 11/2017 | Pelleymounter et al. | |
| 9,844,127 B2 | 12/2017 | Bhutta | |
| 9,852,890 B2 | 12/2017 | Mueller et al. | |
| 9,854,659 B2 | 12/2017 | Van Zyl et al. | |
| 9,865,432 B1 | 1/2018 | Bhutta | |
| 9,952,297 B2 | 4/2018 | Wang | |
| 10,008,317 B2 | 6/2018 | Iyer | |
| 10,020,752 B1 | 7/2018 | Vinciarelli | |
| 10,026,592 B2 | 7/2018 | Chen | |
| 10,026,594 B2 | 7/2018 | Bhutta | |
| 10,026,595 B2 | 7/2018 | Choi et al. | |
| 10,074,518 B2 | 9/2018 | Van Zyl et al. | |
| 10,139,285 B2 | 11/2018 | Murray et al. | |
| 10,141,788 B2 | 11/2018 | Kamstedt | |
| 10,194,518 B2 | 1/2019 | Van Zyl et al. | |
| 10,217,618 B2 | 2/2019 | Larson et al. | |
| 10,224,184 B2 | 3/2019 | Van Zyl | |
| 10,224,186 B2 | 3/2019 | Polak et al. | |
| 10,263,577 B2 | 4/2019 | Van Zyl et al. | |
| 10,269,540 B1 | 4/2019 | Carter et al. | |
| 10,314,156 B2 | 6/2019 | Van Zyl et al. | |
| 10,332,730 B2 | 6/2019 | Christie et al. | |
| 10,340,879 B2 | 7/2019 | Mavretic | |
| 10,373,811 B2 | 8/2019 | Christie et al. | |
| 10,374,070 B2 | 8/2019 | Wood | |
| 10,410,836 B2 | 9/2019 | McChesney | |
| 10,411,769 B2 | 9/2019 | Bae | |
| 10,447,174 B1 | 10/2019 | Porter, Jr. et al. | |
| 10,469,108 B2 | 11/2019 | Howald | |
| 10,475,622 B2 | 11/2019 | Pankratz et al. | |
| 2003/0150710 A1 | 8/2003 | Evans et al. | |
| 2003/0230984 A1 | 12/2003 | Kitamura et al. | |
| 2004/0026235 A1 | 2/2004 | Stowell, Jr. | |
| 2005/0045475 A1 | 3/2005 | Wantanabe | |
| 2005/0270805 A1 | 12/2005 | Yasumura | |
| 2006/0005928 A1 | 1/2006 | Howald | |
| 2006/0169582 A1 | 8/2006 | Brown et al. | |

(56) References Cited

U.S. PATENT DOCUMENTS

| | | |
|---|---|---|
| 2006/0169584 A1 | 8/2006 | Brown et al. |
| 2007/0121267 A1 | 5/2007 | Kotani |
| 2008/0061793 A1 | 3/2008 | Anwar et al. |
| 2008/0061901 A1 | 3/2008 | Gilmore |
| 2008/0317974 A1 | 12/2008 | de Vries |
| 2009/0026964 A1 | 1/2009 | Knaus |
| 2010/0012029 A1 | 1/2010 | Forester et al. |
| 2010/0096261 A1 | 4/2010 | Hoffman et al. |
| 2010/0098882 A1 | 4/2010 | Lubomirsky et al. |
| 2010/0314048 A1 | 12/2010 | Long et al. |
| 2011/0121735 A1 | 5/2011 | Penny |
| 2011/0140607 A1 | 6/2011 | Moore et al. |
| 2011/0148303 A1 | 6/2011 | Van Zyl et al. |
| 2012/0097104 A1 | 4/2012 | Pipitone et al. |
| 2012/0097524 A1 | 4/2012 | Pipitone et al. |
| 2012/0145322 A1 | 6/2012 | Gushiken et al. |
| 2012/0262064 A1 | 10/2012 | Nagarkatti |
| 2013/0140984 A1 | 6/2013 | Hirayama |
| 2013/0180964 A1 | 7/2013 | Ilic |
| 2013/0214683 A1 | 8/2013 | Valcore et al. |
| 2013/0278140 A1 | 10/2013 | Mudunuri et al. |
| 2013/0345847 A1 | 12/2013 | Valcore et al. |
| 2014/0225504 A1 | 8/2014 | Kaneko |
| 2014/0239813 A1 | 8/2014 | Van Zyl |
| 2014/0265911 A1 | 9/2014 | Kamata et al. |
| 2014/0367043 A1 | 12/2014 | Bishara et al. |
| 2015/0115797 A1 | 4/2015 | Yuzurihara |
| 2015/0002020 A1 | 8/2015 | Boston |
| 2015/0313000 A1 | 10/2015 | Thomas et al. |
| 2016/0002020 A1 | 1/2016 | Orita |
| 2016/0248396 A1 | 8/2016 | Mavretic |
| 2016/0308560 A1 | 10/2016 | Howald et al. |
| 2017/0133886 A1 | 5/2017 | Kurs et al. |
| 2017/0338081 A1 | 11/2017 | Yamazawa |
| 2017/0345620 A1 | 11/2017 | Coumou et al. |
| 2018/0034446 A1 | 1/2018 | Wood |
| 2018/0261431 A1 | 9/2018 | Hammond, IV |
| 2019/0172683 A1 | 6/2019 | Mavretic |
| 2019/0199241 A1 | 6/2019 | Satoshi et al. |

FOREIGN PATENT DOCUMENTS

| | | |
|---|---|---|
| CN | 1582485 A | 2/2005 |
| CN | 200962339 Y | 10/2007 |
| CN | 101454851 A | 6/2009 |
| CN | 102203888 A | 9/2011 |
| CN | 102611210 A | 7/2012 |
| CN | 10570455 A | 11/2015 |
| CN | 206415543 U | 8/2017 |
| CN | 107304753 A | 10/2017 |
| CN | 107796974 A | 3/2018 |
| CN | 108109826 A | 6/2018 |
| CN | 208622519 U | 3/2019 |
| CN | 109643605 A | 4/2019 |
| DE | 538664 C | 11/1931 |
| EP | 0065147 A1 | 11/1982 |
| EP | 3376513 A1 | 9/2018 |
| EP | 3416174 A1 | 12/2018 |
| ES | 2951500 A1 | 2/1964 |
| GB | 238560 A | 7/1926 |
| GB | 563452 A | 8/1944 |
| JP | 5863117 A | 4/1983 |
| JP | 04239211 A | 8/1992 |
| JP | 05284046 A | 8/1993 |
| WO | 2012054305 | 4/2012 |
| WO | 2012054306 | 4/2012 |
| WO | 2012054307 | 4/2012 |
| WO | 2016048449 A1 | 3/2016 |
| WO | 2016097730 | 6/2016 |
| WO | 2019096564 A1 | 5/2019 |

OTHER PUBLICATIONS

PCT/US2020/038899—International Search Report and Written Opinion of the International Searching Authority, dated Sep. 26, 2019, 5 pages.

PCT/US2018/062951—International Search Report and Written Opinion of International Searching Authority, dated Aug. 28, 2019, 10 pages.

Stowell, et al., "RF-superimposed DC and pulsed DC sputtering for deposition of transparent conductive oxides", Thin Solid Films 515 (2007), pp. 7654-7657.

Bender, et al., "Characterization of a RF=dc-magnetron discharge for the sputter deposition of transparent and highly conductive ITO films", Appl. Phys. A 69, (1999), pp. 397-409.

Economou, Demetre J., "Fundamentals and application of ion-ion plasmas", Applied Surface Science 253 (2007), pp. 6672-6680.

Godyak et al., "Plasma parameter evolution in a periodically pulsed ICP", XXVIIth, Eindhoven, the Netherlands, Jul. 18-22, 2005, 4 pages.

Banna, et al., "Inductively Coupled Pulsed Plasmas in the Presence of Synchronous Pulsed Substrate Bias for Robust, Reliable, and Fine Conductor Etching", IEEE Transactions on Plasma Science, vol. 37, No. 9, Sep. 2009, pp. 1730-1746.

Kushner, Mark J., "Pulsed Plasmas as a Method to Improve Uniformity During Materials Processing", Journal of Applied Physics, Jul. 1, 2004, vol. 96, No. 1, pp. 82-93.

LTM Technologies, M. Haass "Synchronous Plasma Pulsing for Etch Applications", Apr. 3, 2010 16 pages.

PCT/US2020/048630 EESR dated Sep. 1, 2023, 10 pages.

1st Office Action Chinese Application 202080052752.6, dated Dec. 22, 2023.

\* cited by examiner

HIGH POWER LOW FREQUENCY COILS

CROSS-REFERENCE TO RELATED APPLICATION

This application claims priority to U.S. Provisional Patent Application No. 62/893,066 filed Aug. 28, 2019, the contents of which are incorporated herein by reference.

BACKGROUND

Radio frequency (RF) Plasma-enhanced processing is extensively used in semiconductor manufacturing to etch different types of films, deposit thin films at low to intermediate processing temperatures and perform surface treatment and cleaning. Characteristic of such processes is the employment of a plasma, i.e., a partially ionized gas, that is used to generate neutral species and ions from precursors inside a reaction chamber, provide energy for ion bombardment, and/or perform other actions.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Further, as used herein, the article "a" is intended to have its ordinary meaning in the patent arts, namely "one or more." Herein, the term "about" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

Typical cylindrical single layer coils may have a number of issues and limitations in use. For example, typical cylindrical single layer coils may have a reduced Q factor when the length is greater than the diameter. Additionally, such coils have experienced poor cooling due to trapped air adjacent to the cylinder coil form when wound on a dielectric cylinder. Coils may also have a relatively long magnetic field return path that may result in high coupling coefficient to aluminum shield housing walls that produce eddy losses that result in lower Q values. Typical coils may also have lower inductance per unit length of wire that may result in lower Q values. Such coils may also have less predictable manufacturing tolerances.

Embodiments of the present disclosure may decrease losses in voltage and current at high power, which results in better Q values due to better stored to dissipated energy ratios. Embodiments of the present disclosure may also advantageously maximize inductance per unit length of wire used, thereby resulting in better Q values. Such embodiments may further reduce distributed voltage across windings thereby reducing voltage stress potentials internally. Embodiments may further reduce magnetic field coupling to aluminum shield housing by optimizing magnetic field return paths, thereby reducing coupled eddy losses to the shield. Embodiments may also increase airflow around the inductor wire to improve cooling. Other advantages may include a mechanical form that provides predictable wire dimensional spacing in X, Y, and Z directions resulting in tighter manufacturing tolerance spread. Not all embodiments will exhibit all these characteristics and, to the extent that they exhibit more than one, they may not do so to the same extent.

Embodiments of the present disclosure may provide relatively high-power low frequency coils, such as for example, coils having a frequency of about 400 k. In other embodiments, coils disclosed herein may have frequencies lower than 400 k and/or higher than 400 k depending on the application. Additionally, the disclosed geometry compacts the magnetic fields so as to reduce coupling interactions with the shield walls surrounding a coil. Furthermore, the registered start of each winding from the same side reduces the voltage stress from layer to layer allowing higher voltage operation than a continuous filament sequentially wound coil of multiple layers traversing from side to side. The geometric positioning of wires for equal spacing may also result in close tolerance repeatability approaching +/−1 percent.

Figure 1:
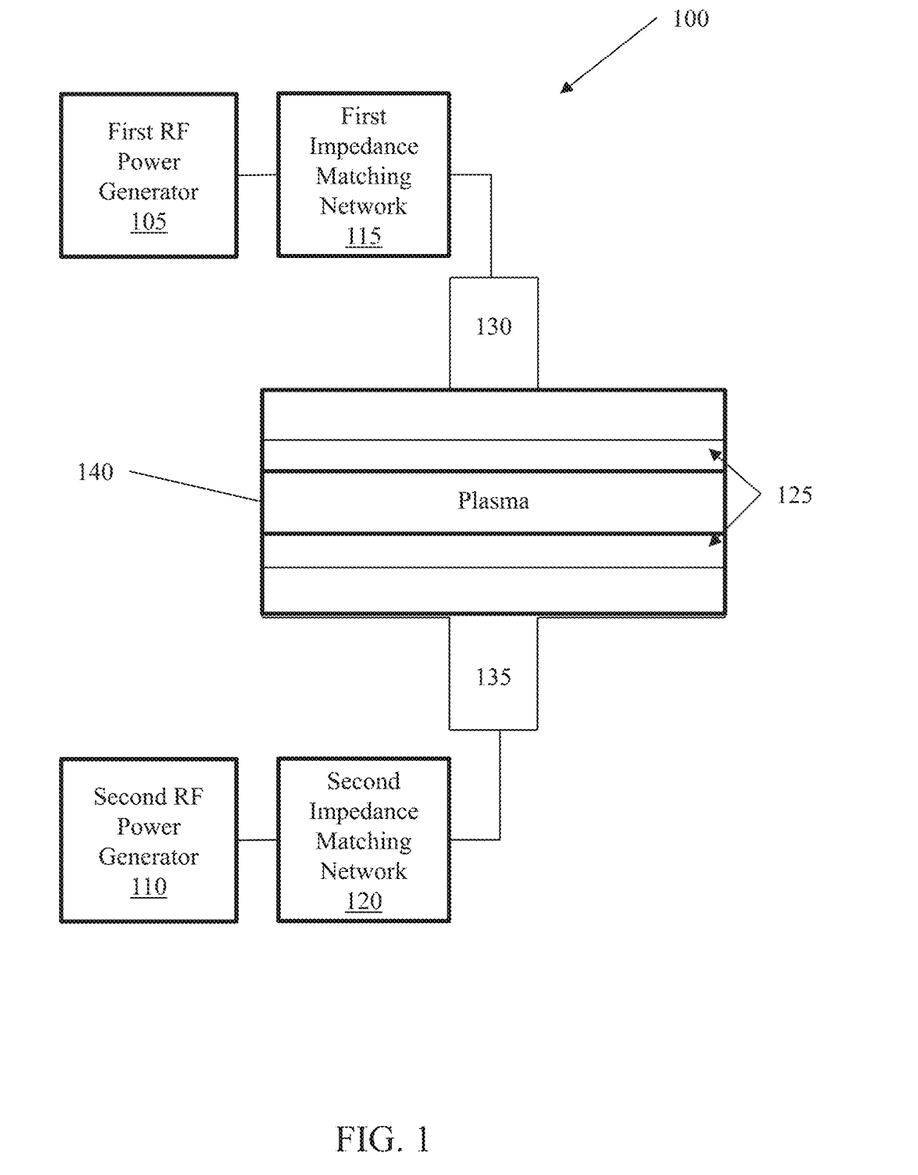
FIG. 1 is a schematic representation of a RF plasma processing system according to embodiments of the present disclosure.

Turning to FIG. 1, a side view schematic representation of a RF plasma processing system 100, according to embodiments of the present disclosure is shown. RF plasma processing system 100 includes a first RF generator 105 and a second RF generator 110, a first impedance matching network 115, a second impedance matching network 120, a sheath 125, a plasma powering device, such as showerhead 130 or equivalent powered element such as an electrode, and a pedestal 135. As used herein, plasma power devices may refer to any device that introduces power to generate plasma and may include, for example, showerhead 130 and/or other types of electrodes, as well as antenna and the like.

RF plasma processing system 100 may include one or more first and second RF generators 105, 110 that deliver power to a reaction chamber 140 through one or more impedance matching networks 115, 120. RF power flows from the first RF generator 105 through the impedance matching network 115 to showerhead 130 into plasma in reaction chamber 140, to an electrode (not shown) other than showerhead 130, or to an inductive antenna (not shown) that electromagnetically provides power to the plasma, where after the power flows from the plasma to ground and/or to pedestal 135 and/or to second impedance matching network 120. Generally, first impedance matching network 115 compensates for variations in a load impedance inside reaction chamber 140 so the combined impedance of showerhead 130 and first impedance matching network 115 equal the output of first RF generator 105, e.g., 50 ohms, by adjusting the reactive components (not separately shown), e.g., variable capacitors, within first impedance matching network 115.

Impedance matching networks 115, 120 are designed to adjust their internal reactive elements such that the load impedance matches the source impedance. Embodiments of the present disclosure may be used in impedance matching networks 115, 120, filters (not shown), resonators (not shown), and the like.

Figure 2:
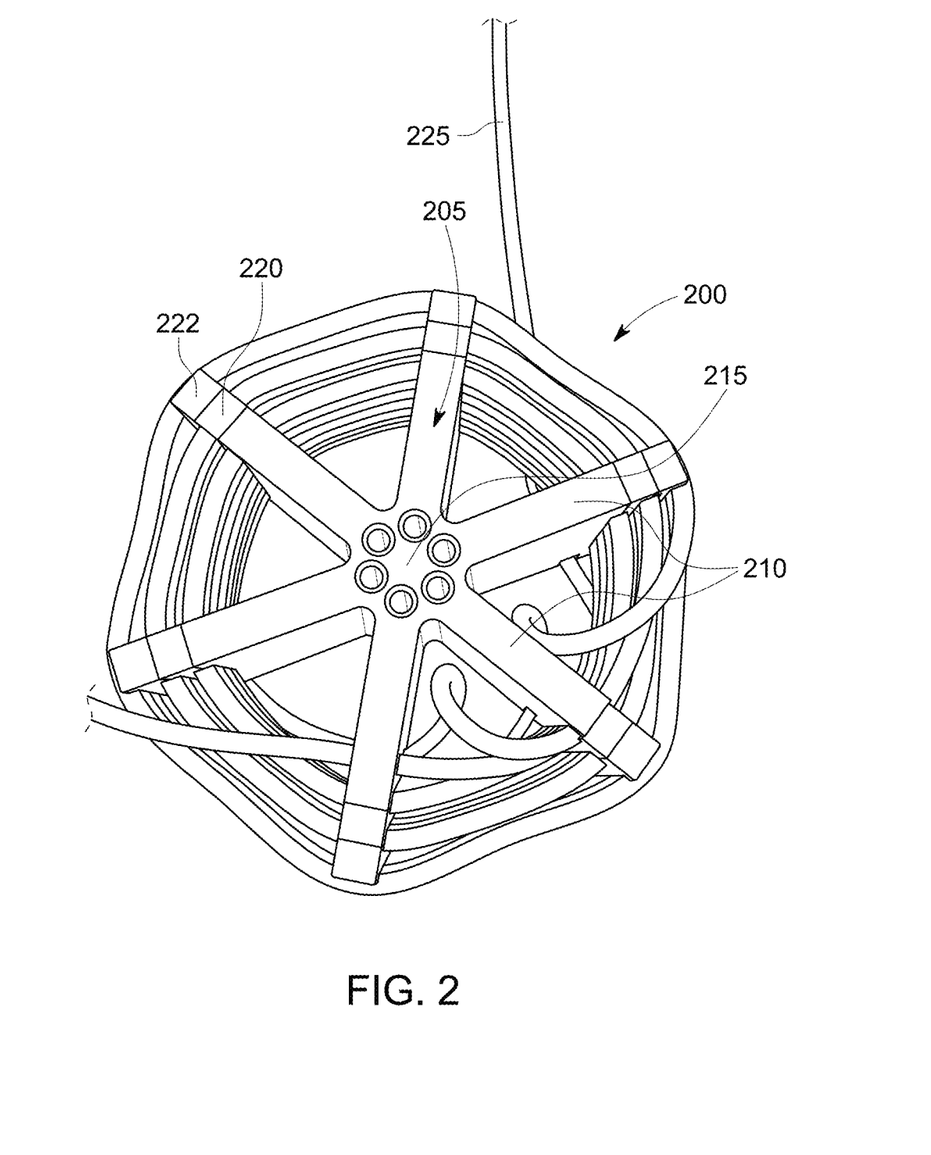
FIG. 2 is a side view of a coil according to embodiments of the present disclosure.

Turning to FIG. 2, a side view of a coil according to embodiments of the present disclosure is shown. In this embodiment, a coil 200 includes a coil form 205, which is shown having six coil form extensions 210. While six coil form extensions 210 are shown, in other embodiments, coil form 205 may be three, four, five, seven, or more coil form extensions 210. Coil form extensions 210 may project radially outward from a coil form center 215. Coil form center 215 may be used to attach coil 200 to a block (not shown), that will be illustrated below.

Figure 3:
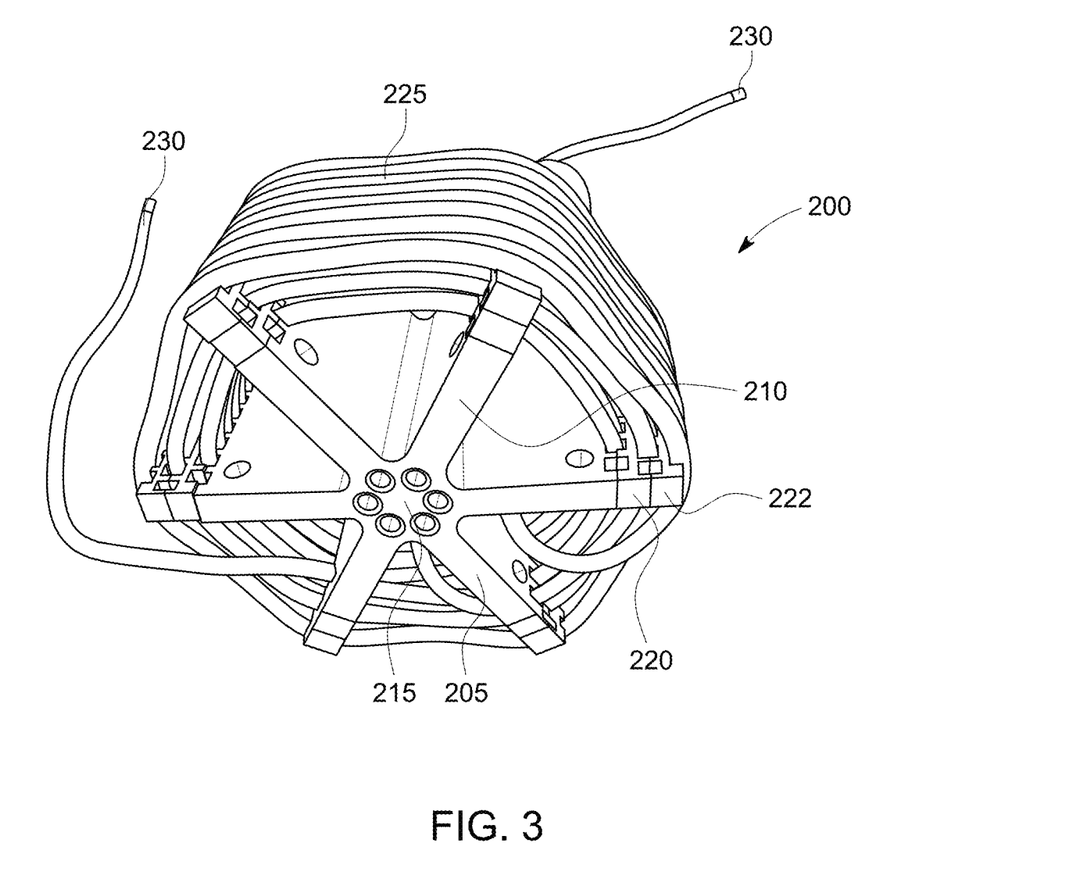
FIG. 3 is a side elevation view of the coil of FIG. 2 according to embodiments of the present disclosure.
Figure 5:
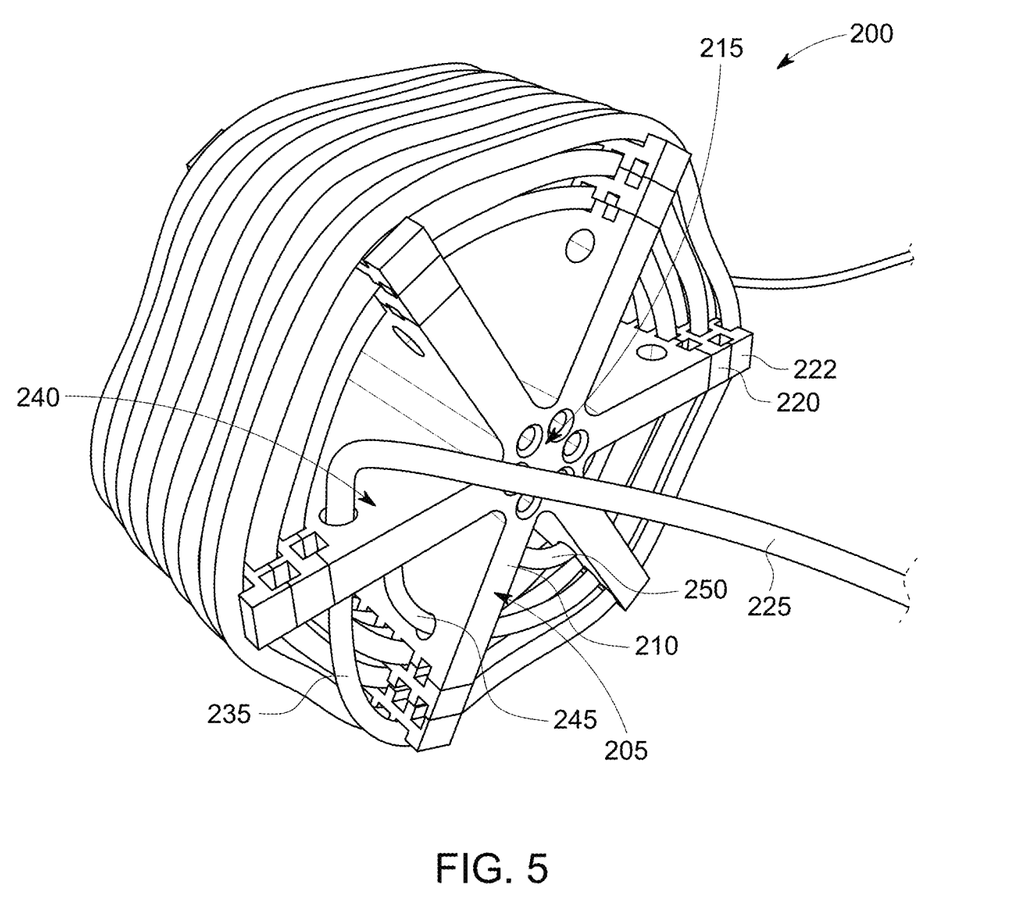
FIG. 5 is a side perspective view of the coil of FIG. 2 according to embodiments of the present disclosure.

One or more spacers 220/222, shown best in FIG. 3 and FIG. 5, may be disposed on a radially outward edge of one or more coil form extensions 210. In this embodiment, two spacers 220/222 are illustrated with one inward spacer 220 disposed radially inward and a second outward spacer 222 disposed radially outward. Spacers 220/222 may be formed from the same material as coil form 205, or in other embodiments may be formed from other materials.

A wire 225 may be concentrically wrapped around coil form 205 and coil form extensions 210, starting at the center, i.e., at the radially outward edge of coil form 205. Inward spacer 220 may then be disposed on top of coil form 205, and wire 225 may be wrapped through inward spacer 220. Outward spacer 222 may then be disposed on top of inward spacer 200, and wire 225 may be wrapper through outward spacer 222.

In other embodiments, more than one wire 225 may be used. For example, a first wire may be wrapped around coil form 205. A second wire may be wrapped around inward spacer 220 and a third wire may be wrapped around outward spacer 222. The three wires may then be connected using one or more electrical connectors, such as an electric bus.

In operation, coil 200 includes a cylindrical winding that includes multiple layers, which in this embodiments includes three layers of windings. The winding starts at the innermost diameter, and the winding continues for seven turns, which will be illustrated in greater detail below. At the end of the innermost diameter, wire 225 returns through the center of coil form 205 back to the starting position and then overlays the first winding to start a second winding., where the first winding started. The second winding continues to its end, which in this embodiment includes eight turns. The second winding, once reaching the end, returns through the center of coil form 205. Wire 225 may then continue for a third winding, which in this embodiment includes nine turns. At the end of the third winding, the wire may exit coil 200, to be electrically connected to other components through, for example, a lug (not shown) or other types of electrical connectors.

By providing the three continuous windings the number of layers that are used is decreased. As such, by using three windings, the voltage stress may be divided by a factor of three. If each winding included the same length of turns, wire 225 would end up with the same amount of voltage across it. Additionally, such geometry compacts the magnetic fields such as to reduce coupling interactions with shield walls (not shown) that surround coil 200 in operation.

Aspects of coil 200 may also include a start of each winding that starts from the same side of coil 200, coil form 205, and coil form extensions 210. By starting from the same side of coil 200, voltage stress may be reduced from layer to layer allowing higher voltage operation than a continuous filament sequentially would coil, where multiple layers traverse from side to side. Additionally, the geometric positioning of the wires provide for equal spacing, which results in close tolerance repeatability in a range of around one percent. Specific design aspects of coil 200, as a multifilar coil will be discussed in detail below.

Turning to FIG. 3, a side elevation view of the coil 200 according to embodiments of the present disclosure is shown. As discussed above, coil 200 includes coil form 205, which is shown having six coil form extensions 210. As illustrated, coil form extensions 210 project radially outward from coil form center 215. One or more spacers 220/222 may be disposed on a radially outward edge of one or more coil form extensions 210. In this embodiment, two spacers 220/222 are illustrated with one inward spacer 220 disposed radially inward and a second outward spacer 222 disposed radially outward.

Wire 225 may be concentrically wrapped around coil form 205 and coil form extensions 210, starting at the center, i.e., at the radially outward edge of coil form 205. Inward spacer 220 may then be disposed on top of coil form 205, and wire 225 may be wrapped through inward spacer 220. Outward spacer 222 may then be disposed on top of inward spacer 200, and wire 225 may be wrapper through outward spacer 222.

Both ends of wire 225 may include electrical connectors 230, such as lugs. In certain embodiments electrical connectors 230 may include other types of connectors, such as, for example, male-female connectors, screw connectors, bolt connectors, and/or any other types of electrical connectors 230 used or suitable in the art. In certain embodiments, electrical connectors 230 may be insulated or partially insulated, depending on operational requirements.

Figure 4:
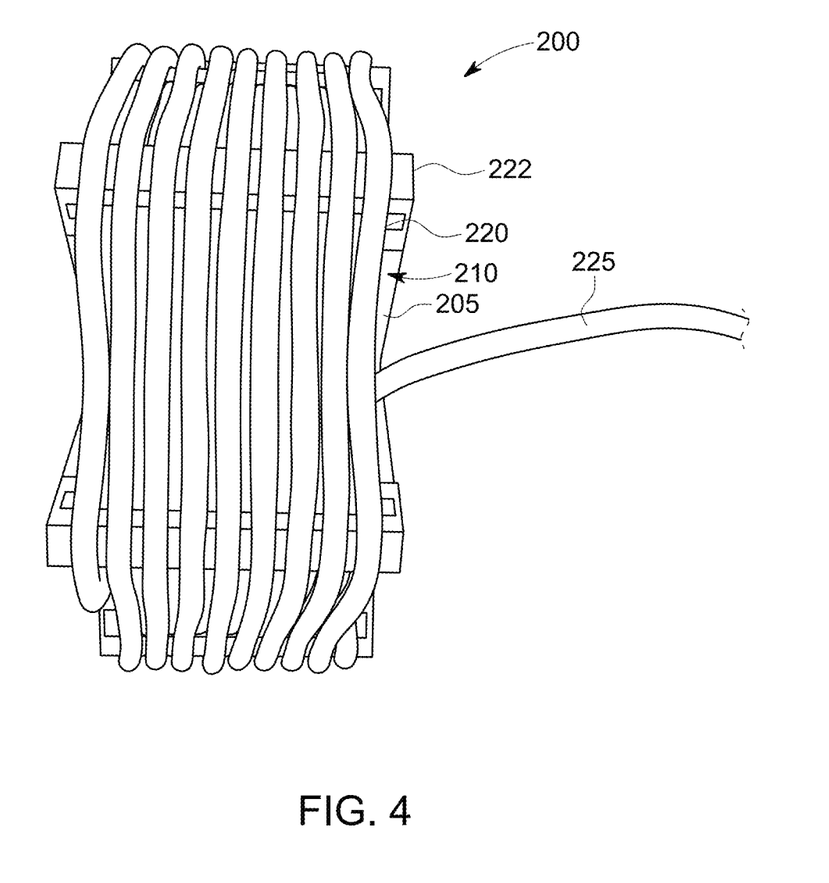
FIG. 4 is an end view of the coil of FIG. 2 according to embodiments of the present disclosure.

Turning to FIG. 4, an end view of coil 200 according to embodiments of the present disclosure is shown. As discussed above, coil 200 includes coil form 205, which is shown having six coil form extensions 210. As illustrated, coil form extensions 210 project radially outward from coil form center 215. One or more spacers 220/222 may be disposed on a radially outward edge of one or more coil form extensions 210. In this embodiment, two spacers 220/222 are illustrated with one inward spacer 220 disposed radially inward and a second outward spacer 222 disposed radially outward.

Wire 225 may be concentrically wrapped around coil form 205 and coil form extensions 210, starting at the center, i.e., at the radially outward edge of coil form 205. Inward spacer 220 may then be disposed on top of coil form 205, and wire 225 may be wrapped through inward spacer 220. Outward spacer 222 may then be disposed on top of inward spacer 200, and wire 225 may be wrapper through outward spacer 222.

As illustrated in FIG. 4, the third winding, i.e., the outermost radial winding includes nine windings. As discussed above, the middle, or second winding includes eight windings, while the innermost radial winding includes seven windings. As such, a triangular winding form results, which may provide one or more of the advantages discussed above. The triangular winding form will be illustrated and discussed in greater detail below.

Turning to FIG. 5, a side perspective view of coil 200 according to embodiments of the present disclosure is shown. In FIG. 5, certain portions of wire 225 have been removed for clarity as to the geometric structure of other components, such as coil form 205 and spacers 220/222. As discussed above, coil 200 includes coil form 205, which is shown having six coil form extensions 210. As illustrated, coil form extensions 210 project radially outward from coil form center 215. One or more spacers 220/222 may be disposed on a radially outward edge of one or more coil form extensions 210. In this embodiment, two spacers 220/222 are illustrated with one inward spacer 220 disposed radially inward and a second outward spacer 222 disposed radially outward.

Wire 225 may be concentrically wrapped around coil form 205 and coil form extensions 210, starting at the center, i.e., at the radially outward edge of coil form 205. Inward spacer 220 may then be disposed on top of coil form 205, and wire 225 may be wrapped through inward spacer 220. Outward spacer 222 may then be disposed on top of inward spacer 200, and wire 225 may be wrapper through outward spacer 222.

Figure 6:
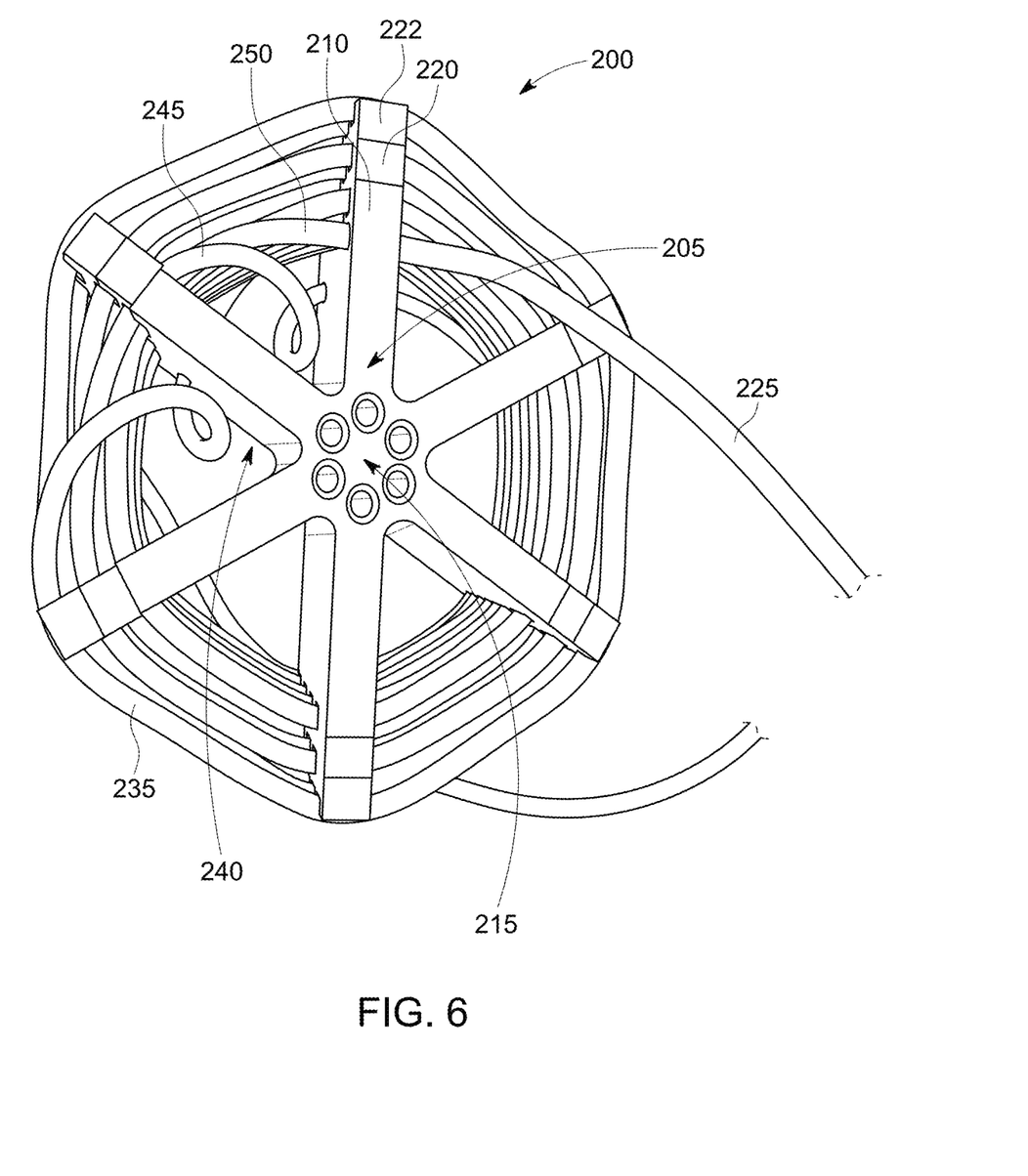
FIG. 6 is a side view of the coil of FIG. 2 according to embodiments of the present disclosure.

Turning to FIG. 6, a side view of coil 200 according to embodiments of the present disclosure is shown. As discussed above, coil 200 includes coil form 205, which is shown having six coil form extensions 210. As illustrated, coil form extensions 210 project radially outward from coil form center 215. One or more spacers 220/222 may be disposed on a radially outward edge of one or more coil form extensions 210. In this embodiment, two spacers 220/222 are illustrated with one inward spacer 220 disposed radially inward and a second outward spacer 222 disposed radially outward.

Wire 225 may be concentrically wrapped around coil form 205 and coil form extensions 210, starting at the center, i.e., at the radially outward edge of coil form 205. Inward spacer 220 may then be disposed on top of coil form 205, and wire 225 may be wrapped through inward spacer 220. Outward spacer 222 may then be disposed on top of inward spacer 200, and wire 225 may be wrapper through outward spacer 222.

As discussed with respect to FIG. 5, the outermost winding 235 returns to the center of the winding 240 before exiting coil 200 to be connected to another device. Similarly, the middle winding 245 also returns to the center of the winding 240 before being wound into the third winding 240. The innermost winding 250 also returns to the center of the winding 240 being would into the middle winding 245.

Figure 7:
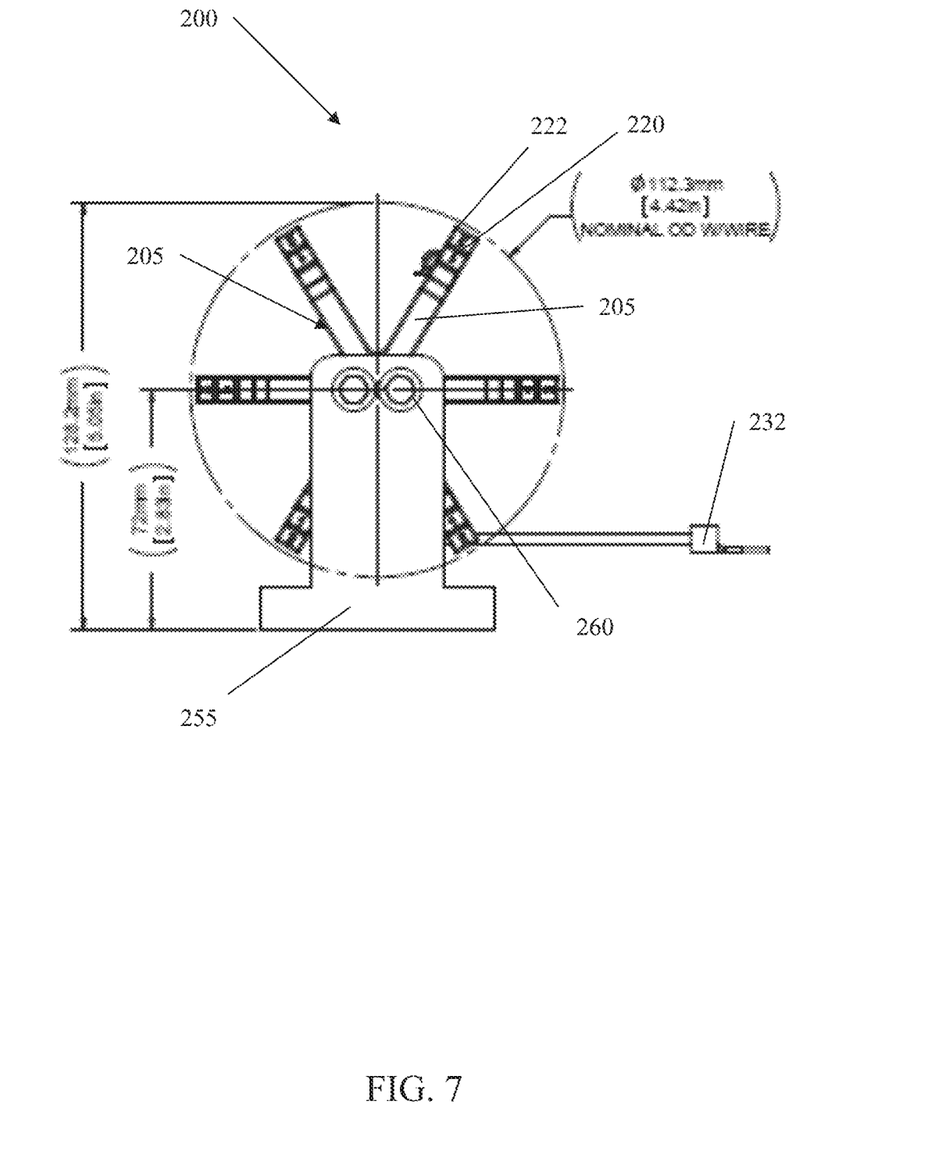
FIG. 7 is a side view of a coil in a coil block according to embodiments of the present disclosure.

Turning to FIG. 7, a side view of a coil in a coil block according to embodiments of the present disclosure is shown. In this embodiment, coil 200 includes coil form 205, which is shown having six coil form extensions 210. As illustrated, coil form extensions 210 project radially outward from coil form the coil center. One or more spacers 220/222 may be disposed on a radially outward edge of one or more coil form extensions 210. In this embodiment, two spacers 220/222 are illustrated with one inward spacer 220 disposed radially inward and a second outward spacer 222 disposed radially outward.

In this illustration, coil 200 is shown disposed within a coil block 255. Coil 200 may be connected to coil block 255 through various types of mechanical attachments 260 such as, for example, bolts. Coil block 255 may be formed from various materials, including those of which coil 200 is formed. Coil block 255 may be used to hold coil 200 in place during operation and may be connected to housing (not shown) or other components using one or more attachment points 265. Coil block 255 and wire 225 windings will be explained in greater detail with respect to FIG. 8.

Figure 8:
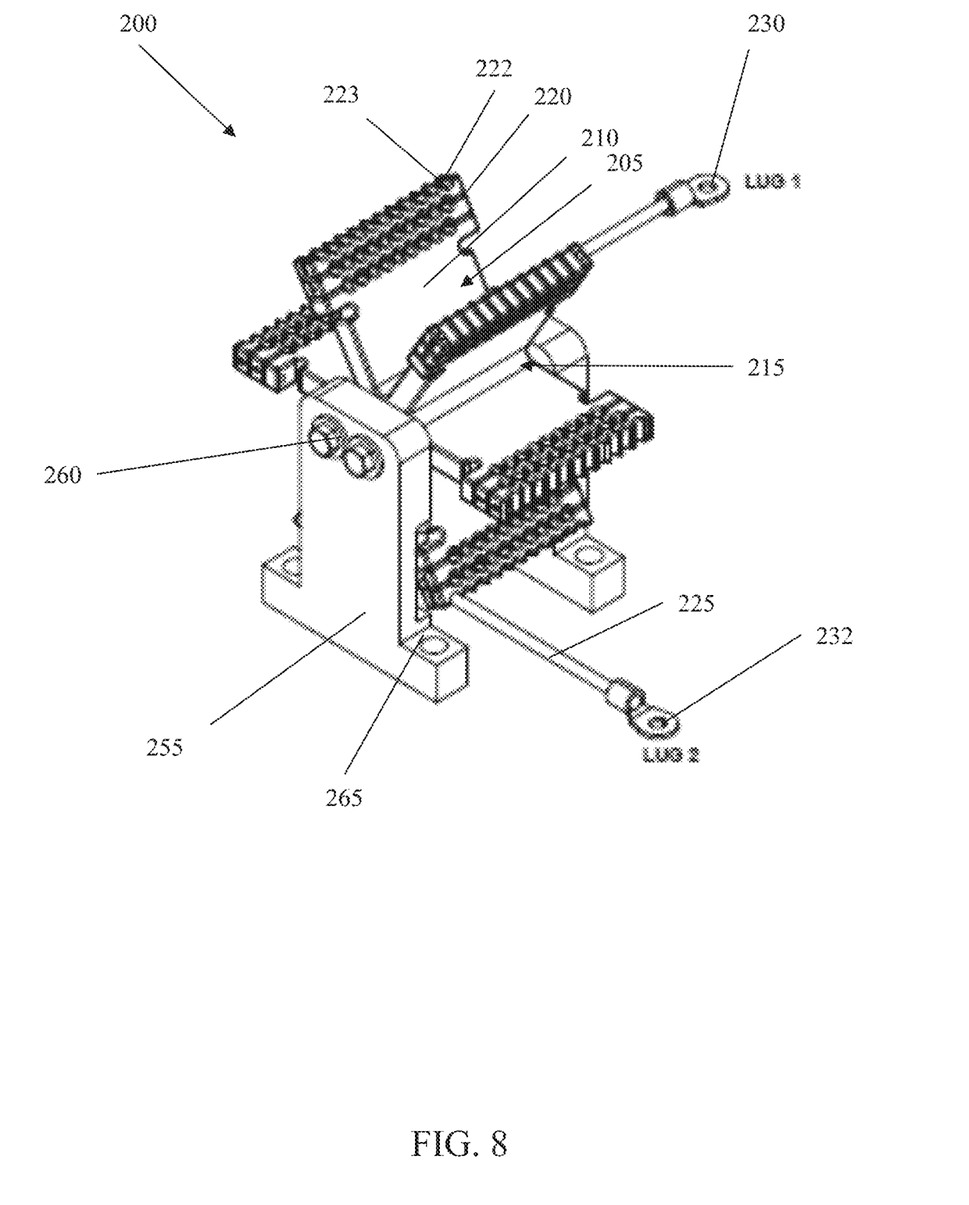
FIG. 8 is an elevated perspective schematic representation of a coil in FIG. 7 in a coil block according to embodiments of the present disclosure.

Turning to FIG. 8, a side a schematic cross-sectional representation of a coil according to embodiments of the present disclosure is shown. As discussed above, coil 200 includes coil form 205, which is shown having six coil form extensions 210. As illustrated, coil form extensions 210 project radially outward from coil form center 215. One or more spacers 220/222 may be disposed on a radially outward edge of one or more coil form extensions 210. In this embodiment, two spacers 220/222 are illustrated with one inward spacer 220 disposed radially inward and a second outward spacer 222 disposed radially outward.

Wire 225 may be concentrically wrapped around coil form 205 and coil form extensions 210, starting at the center, i.e., at the radially outward edge of coil form 205. Inward spacer 220 may then be disposed on top of coil form 205, and wire 225 may be wrapped through inward spacer 220. Outward spacer 222 may then be disposed on top of inward spacer 200, and wire 225 may be wrapper through outward spacer 222. Wire 225 may pass through a respective set of grooves 223 that are formed in coil form 205, inward spacer 220, and outward spacer 222.

Coil 200 also is illustrated having two electrical connectors 230/232. First electrical connector 230 starts the inner most, first, winding, while second electrical connector terminates as the outermost, third, winding. As shown, both electrical connectors 230/232 are shown as lugs, but other electrical connectors, such as those described above may also be used.

In this illustration, coil 200 is shown disposed within a coil block 255. Coil 200 may be connected to coil block 255 through various types of mechanical attachments 260 such as, for example, bolts. Coil block 255 may be formed from various materials, including those of which coil 200 is formed. Foil block 255 may be used to hold coil 200 in place during operation and may be connected to housing (not shown) or other components using one or more attachment points 265.

Figure 9:
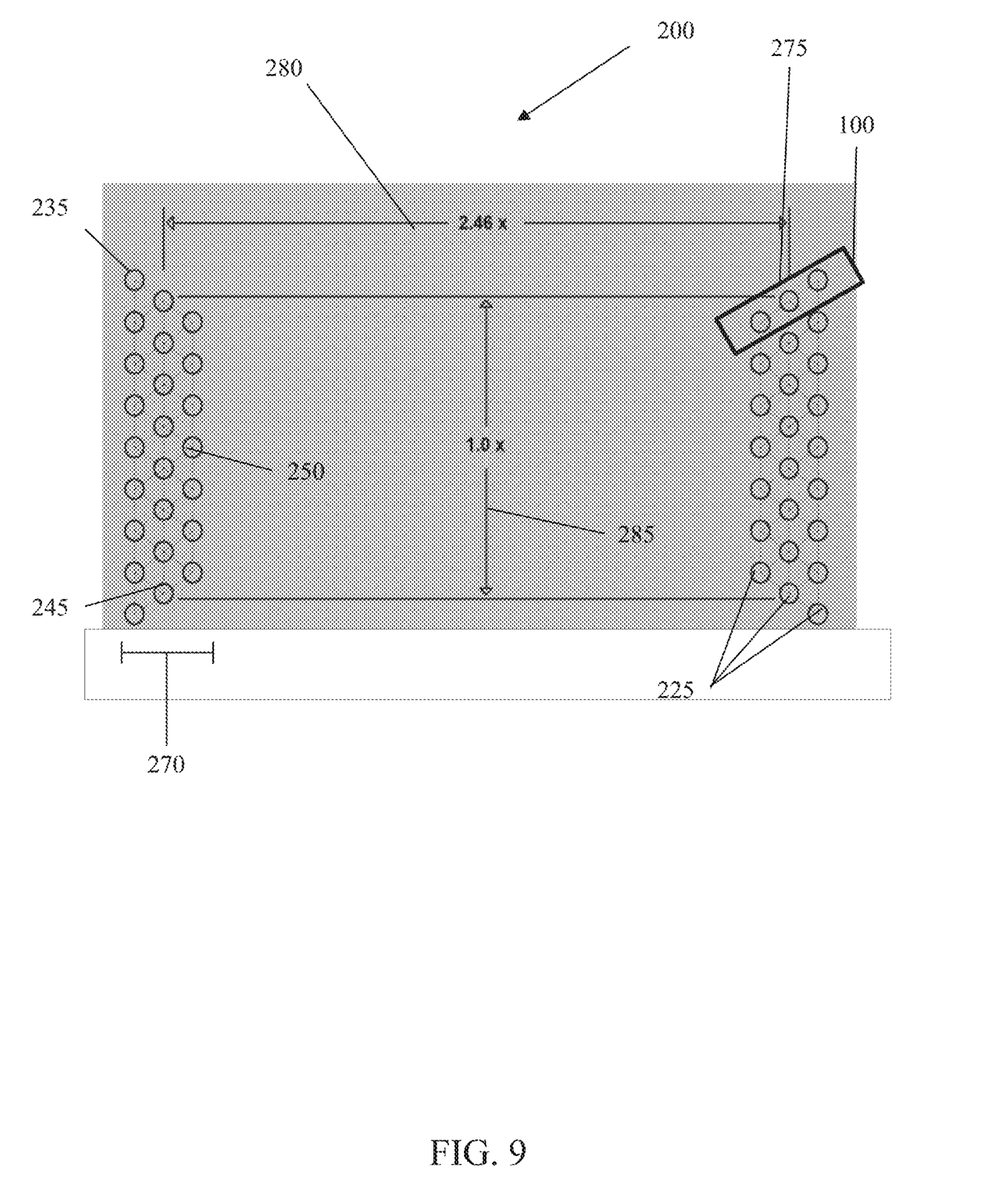
FIG. 9 is a schematic cross-sectional representation of a coil according to embodiments of the present disclosure.

Turning to FIG. 9, a schematic cross-sectional representation of coil 200 according to embodiments of the present disclosure is shown. In this embodiment, coil 200 is shown having three windings of wire 225. An innermost, first winding 250, a middle, second winding 245, and an outermost, third winding 235. Each winding would in relation to each adjacent wire is spaced both axially and radially at a fixed distance, so that a cross-section of completed concentric layers of winding forms a unilateral triangle is disposition of all conductor centers. The unilateral triangle geometry is illustrated at reference character 270. The progression of winding turn count of one turn per layer may thereby optimize field return path. The winding turn count of one turn per layer is illustrated at reference character 275.

Embodiments of the present disclosure may thus provide a plurality of concentric cylinder or polygonal cross-section windings of wire such that the spacing between any adjacent turn is equal and on the order of 0.25 to 1 radius of the wire used. Such embodiments may include concentric cylinders of wire that are connected so that the start of a first winding continues to a finish-turn and then axially returns to the same starting end of the first winding to start a new larger diameter cylindrical winding layer concentric to the first winding, thereby encompassing the first winding. The start of the second winding continues to a finish-turn and then returns axially to the same starting end as the first and second winding to start a new cylinder of winding concentric to the second and first winding.

The concentric coils may thereby have common registered starts and finishes of each winding. The collective cross-section of windings includes a diameter 280 and a length, which collectively forms a diameter to length 285 ratio, which is the mean diameter, of between 2:1 and 3:1, and in certain embodiments between 2.4:1 and 2.5:1, and in still other embodiments about 2.46:1.

Wire turns may be parallel and perpendicular to the coil axis for $5/6^{th}$ of a turn and step from one guide groove to the next for $1/6^{th}$ of a turn. Such a mechanical technique may thereby simplify construction of the coil during manufacturing. The one turn increase per layer may thereby provide advantages of improved magnetic field coupling and wire separation may be maintained when a wire ascends radially from a lower later to a next layer.

Figure 10:
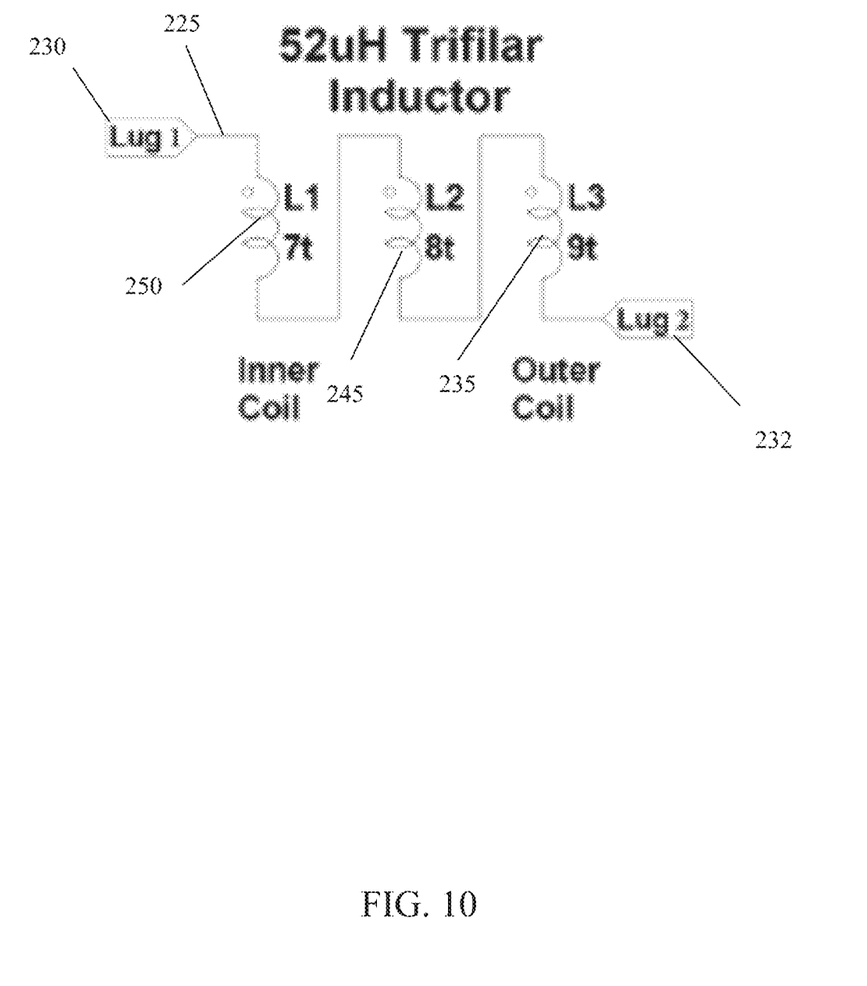
FIG. 10 is a schematic representation of a trifilar inductor according to embodiments of the present disclosure.

Turning to FIG. 10, a schematic representation of a trifilar inductor according to embodiments of the present disclosure is shown. As illustrated, a first electrical connector 230, which in this embodiment is a first lug, is connected to an electrical source (not shown). Wire 225 is then wound into three concentric windings. First winding 250 includes seven turns and forms the innermost portion of the coil. Second winding 245 includes eight turns and forms the middle portion of the coil. Third winding 235 includes nine turns and forms the outermost portion of the coil. Wire 225 then exits coil and truncates at second end connector 232.

Figure 11:
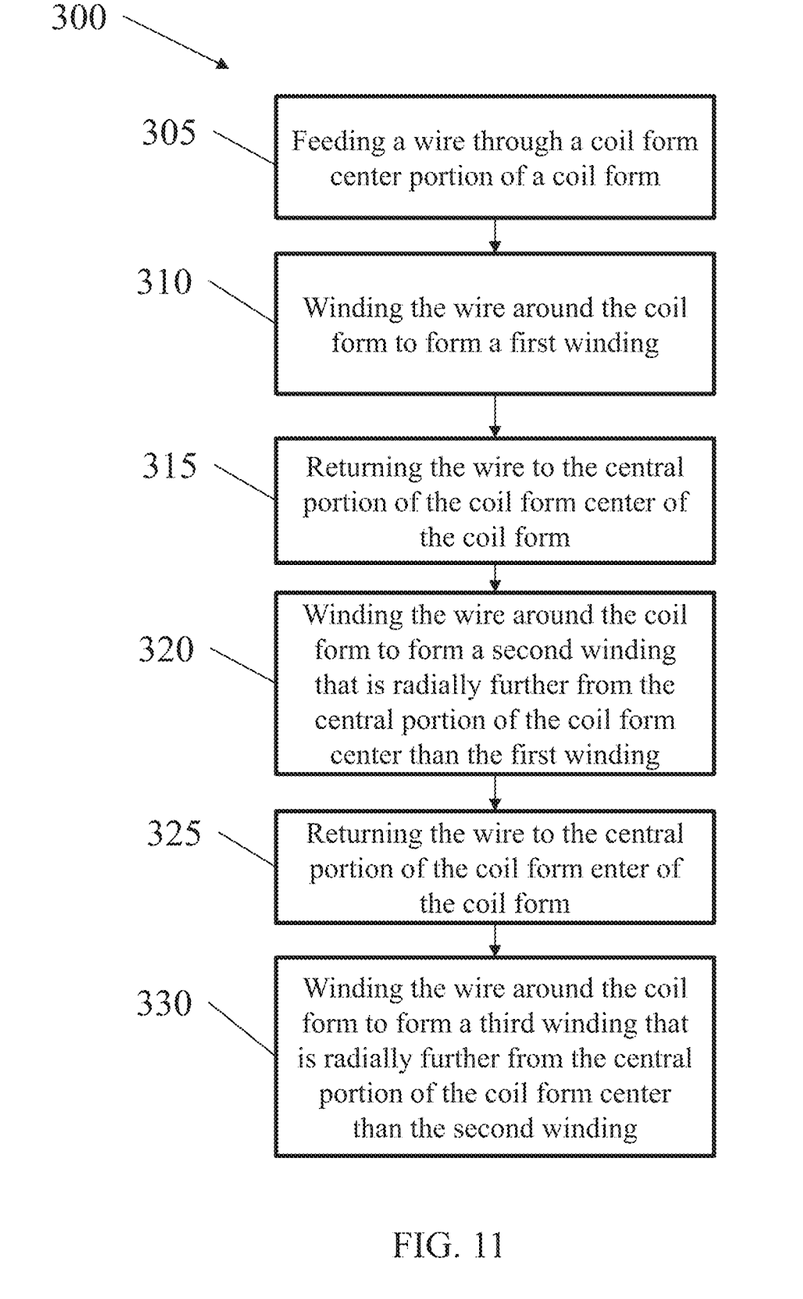
FIG. 11, is a flowchart of a method of forming a coil for a plasma processing device according to embodiments of the present disclosure

Turning to FIG. 11, a flowchart of a method of forming a coil for a plasma processing device according to embodiments of the present disclosure is shown. The method includes feeding (block 300) a wire through a coil form a central portion of a coil form. The central portion of the coil form may include one or more apertures that allow the wire to pass through the coil form.

The method may further include winding (block 305) the wire around the coil form to form a first winding. The wire may initially pass through the aperture in the coil form and then pass around a radially outward portion of the coil form. The wire may pass through grooves that are preformed in the coil form, or may be pressed against the coil form, depending on operational requirements.

The method may further include returning (block 310) the wire to the central portion of the coil form center of the coil form. The wire may thereby return to the central portion at a location on the same side as where the first winding started. The final location of the first winding, while on the same side of the coil form, may be located longitudinally at a different location with respect to the aperture the wire initially passed through.

The method may further include winding (block 315) the wire around the coil form to form a second winding that is radially further from the central portion of the coil form center than the first winding. As such, the second winding is outside the first winding. The second winding may start by passing through a second aperture the is on the same side of the coil form as the first aperture but may be in a different longitudinal location.

The method may further include returning (block 320) the wire to the central portion of the coil form center of the coil form. The wire may thereby return to the center portion at a location on the same side as where the first winding started and ended. The final location of the second winding, while on the same side of the coil form, may be located longitudinally at a different location with respect to the aperture the wire initially passed through to start the second winding.

The method may further include winding (block 325) the wire around the coil form to form a third winding that is radially further from the central portion of the coil form central than the second winding. The wire may thereby return to the center portion at a location on the same side as where the first and second windings started and ended. The final location of the third winding, while on the same side of the coil form, may be located longitudinally at a different location with respect to the aperture the wire initially passed through to start the first and/or second windings.

In certain embodiments, the first winding is disposed on at least a portion of the coil form, the second winding is disposed on at least a portion of a first spacer, the first spacer disposed on a radially distal portion of the coil form, and the third winding is disposed on at least a portion of second spacer, the second spacer disposed on the first spacer. The first spacer may be added to the coil after the first winding occurs. The second spacer may be added to the coil after the second winding occurs. Because the spacers are added in sequence, the assembly of the coil may be easier, due to access to the radially outmost edge of the coil during any given winding.

In certain embodiments, the first winding may include seven turns, the second winding may include eight turns, and the third winding may include nine turns. In other embodiments the number of turns for any given winding may vary based on the number of coil form extensions, and the desired results of a particular operation. For example, in certain implementations, a coil may include three progressive windings of four, five, and six winding. Those of ordinary skill in the part will appreciate that variations on the number of turns for easy winding may vary based on desired results.

In certain embodiments, advantages of the present disclosure may provide reduced losses in voltage and current at high power. The reduced loss in voltage and current at high power may thereby result in an increased quality factor relative to typical cylindrical single layer coils.

In certain embodiments, advantages of the present disclosure may provide increased quality factor due to stored to dissipated energy ratios.

In certain embodiments, advantages of the present disclosure may provide an optimized/maximized inductance per unit length of wire used.

In certain embodiments, advantages of the present disclosure may provide reduced distributed voltage across windings reducing internal voltage stress potentials.

In certain embodiments, advantages of the present disclosure may provide reduced magnetic field coupling to aluminum shield housing by optimizing the magnetic field return path, thereby reducing coupled eddy losses to the shield.

In certain embodiments, advantages of the present disclosure may provide increased airflow around the inductor wire for improved cooling.

In certain embodiments, advantages of the present disclosure may provide a mechanical form that provides predictable wire dimensional spacing along the X axis, Y axis, and Z axis, thereby resulting in tighter manufacturing tolerance spread.

The foregoing description, for purposes of explanation, used specific nomenclature to provide a thorough understanding of the disclosure. However, it will be apparent to one skilled in the art that the specific details are not required to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A multi-layer inductor coil, comprising:
   a coil form comprising:
      a coil form center, and
      a plurality of coil form extensions radially extending from the coil form center, each coil form extension elongated in an axial direction; and
   a continuous wire filament wound on the coil form extensions, the continuous wire filament thereby forming a plurality of radially spaced apart concentric winding layers;
      wherein each winding layer comprises a plurality of turns extending in the axial direction; and
      wherein a cross-section of the plurality of radially spaced apart concentric winding layers forms a triangle in the disposition of the continuous wire filament.

2. The multi-layer inductor coil of claim 1, wherein:
   a first winding layer continues to a finish-turn and returns axially to a starting end of a second winding layer; and
   the second winding layer continues to a finish-turn and returns axially to a starting end of a third winding layer.

3. The multi-layer inductor coil of claim 2, wherein:
   the third winding layer is radially further from the coil form center than the second winding layer and extends further in the axial direction than the second winding layer; and
   the second winding layer is radially further from the coil form center than the first winding layer and extends further in the axial direction than the first winding layer.

4. The multi-layer inductor coil of claim 3, wherein a first radial spacing between the first winding layer and the second winding layer is substantially equal to a second radial spacing between the second winding layer and the third winding layer.

5. The multi-layer inductor coil of claim 1, wherein an outer circumferential surface of a radial cross-section of the multi-layer winding is substantially round or polygonal.

6. The multi-layer inductor coil of claim 1, wherein:
   the wire filament defines a wire radius, and
   each winding layer defines a spacing between adjacent turns of 0.25 to 1.0 of the wire radius.

7. The multi-layer inductor coil of claim 1, wherein each winding layer has a diameter to length ratio of between 2:1 and 3:1.

8. The multi-layer inductor coil of claim 1, wherein each winding layer has a diameter to length ratio of between 2.4:1 and 2.5:1.

9. The multi-layer inductor coil of claim 1, wherein each winding layer has a diameter to length ratio of 2.46:1.

10. The multi-layer inductor coil of claim 1, wherein the winding layers extend progressively in the axial direction.

11. The multi-layer inductor coil of claim 1, wherein each coil form extension comprises a plurality of holes and the wire filament is routed through the holes.

12. The multi-layer inductor coil of claim 1, wherein the winding layers comprise a progression of winding turn count of 1 turn per layer.

13. The multi-layer inductor coil of claim 1, operatively connected in at least one of an impedance matching network, a filter, and a resonator of a radio frequency plasma processing system.

14. The multi-layer inductor coil of claim 1, operatively connected in a radio frequency plasma processing system.

15. The multi-layer inductor coil of claim 14, wherein each winding layer has a diameter to length ratio of between 2.4:1 and 2.5:1.

16. The multi-layer inductor coil of claim 14, wherein each winding layer has a diameter to length ratio of 2.46:1.

17. The multi-layer inductor coil of claim 1, fabricated by a method comprising:
   feeding the wire filament onto the coil form at an axial end of the coil form;
   winding the wire filament on the coil form extensions through multiple turns to form a first winding layer extending in the axial direction;
   returning the wire to the axial end of the coil form;
   winding the wire filament on the coil form extensions through multiple turns to form a second winding layer extending in the axial direction that is radially further from the coil form center than the first winding layer;
   returning the wire filament to the axial end of the coil form-coil form center; and
   winding the wire filament on the coil form extensions through multiple turns to form a third winding layer that is radially further from the coil form center than the second winding layer.

18. The multi-layer inductor coil of claim 17, wherein each coil form extension comprises:
   a first portion extending from the coil form center to the first winding layer,
   a first spacer extending from the first winding layer to the second winding layer, and
   a third space extending from the first second winding layer to the third winding layer.

19. The multi-layer inductor coil of claim 17, wherein:
   the third winding layer overlies and extends in the axial further than the second winding layer; and
   the second winding layer overlies and extends in the axial further than the first winding layer.

20. The multi-layer inductor coil of claim 1, wherein the spacing between any adjacent turns in the plurality of radially spaced apart concentric winding layers is equal and on the order of 0.25 to 1 radius of the wire used.

* * * * *